United States Patent
Gambino et al.

(10) Patent No.: US 12,310,139 B2
(45) Date of Patent: *May 20, 2025

(54) SEMICONDUCTOR DEVICES WITH SINGLE-PHOTON AVALANCHE DIODES AND ISOLATION STRUCTURES

(71) Applicant: SEMICONDUCTOR COMPONENTS INDUSTRIES, LLC, Scottsdale, AZ (US)

(72) Inventors: Jeffrey Peter Gambino, Gresham, OR (US); David T. Price, Gresham, OR (US); Marc Allen Sulfridge, Boise, ID (US); Richard Mauritzson, Meridian, ID (US); Michael Gerard Keyes, Dromcollogher (IE); Ryan Rettmann, Hopewell Junction, NY (US); Kevin Mcstay, Hopewell Junction, NY (US)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 18/673,521

(22) Filed: May 24, 2024

(65) Prior Publication Data
US 2024/0321924 A1    Sep. 26, 2024

Related U.S. Application Data

(63) Continuation of application No. 17/302,836, filed on May 13, 2021, now Pat. No. 12,034,025.

(51) Int. Cl.
*H10F 39/00* (2025.01)
*H10F 39/12* (2025.01)

(52) U.S. Cl.
CPC ......... *H10F 39/807* (2025.01); *H10F 39/802* (2025.01); *H10F 39/8057* (2025.01); *H10F 39/199* (2025.01)

(58) Field of Classification Search
CPC .......... H01L 27/1463; H01L 27/14603; H01L 27/14623; H01L 27/1464; H01L 27/14643;
(Continued)

(56) References Cited

U.S. PATENT DOCUMENTS

| | | | |
|---|---|---|---|
| 12,034,025 B2* | 7/2024 | Gambino | .......... H01L 27/14623 |
| 2010/0127314 A1* | 5/2010 | Frach | .................. H01L 31/1804 257/292 |

(Continued)

FOREIGN PATENT DOCUMENTS

WO    2020203222 A1    10/2020

OTHER PUBLICATIONS

Rech et al., "Optical crosstalk in single photon avalanche diode arrays: a new complete model," Optics Express vol. 16, No. 12, 8381 (2008).

(Continued)

*Primary Examiner* — Sitaramarao S Yechuri
(74) *Attorney, Agent, or Firm* — Treyz Law Group, P.C.; Joseph F. Guihan

(57) ABSTRACT

An imaging device may include single-photon avalanche diodes (SPADs). To mitigate crosstalk, isolation structures may be formed around each SPAD. The isolation structures may include front side deep trench isolation structures that extend partially or fully through a semiconductor substrate for the SPADs. The isolation structures may include a metal
(Continued)

filler such as tungsten that absorbs photons. The isolation structures may include a p-type doped semiconductor liner to mitigate dark current. The isolation structures may include a buffer layer such as silicon dioxide that is interposed between the metal filler and the p-type doped semiconductor liner. The isolation structures may have a tapered portion or may be formed in two steps such that the isolation structures have different portions with different properties. An additional filler such as polysilicon or borophosphosilicate glass may be included in some of the isolation structures in addition to the metal filler.

20 Claims, 11 Drawing Sheets

(58) Field of Classification Search
CPC .. H10F 39/807; H10F 39/8057; H10F 39/199; H10F 39/802; H10F 10/163; A23B 70/20; A61K 40/4225; H10D 62/117; H10D 84/80
See application file for complete search history.

(56) References Cited

U.S. PATENT DOCUMENTS

| | | |
|---|---|---|
| 2011/0272561 A1 | 11/2011 | Sanfilippo et al. |
| 2019/0157323 A1 | 5/2019 | Ogi et al. |
| 2021/0193704 A1* | 6/2021 | Sun .................. H01L 27/14627 |
| 2021/0305440 A1* | 9/2021 | Zang ................. H01L 27/1464 |
| 2022/0157867 A1* | 5/2022 | Kawahara ......... H01L 27/14685 |
| 2023/0268365 A1 | 8/2023 | Kurata et al. |

OTHER PUBLICATIONS

Ninkovic et al., "Development of Back Illuminated SiPM at the MPI Semiconductor Laboratory," International workshop on new photon-detectors PD07, 2007.
Otte, "The Silicon Photomultiplier—A new device for High Energy Physics, Astroparticle Physics, Industrial and Medical Applications," SNIC Symposium, Stanford, California—Apr. 3-6, 2006.
Charbon et al., "A Dual Backside-Illuminated 800-Cell Multi-Channel Digital SiPM with 100 TDCs in 130nm 3D IC Technology," IEEE Nuclear Science Symposium and Medical Imaging Conference (NSS/MIC) , 2014.
He et al., "Simulations of the breakdown characteristics of n-on-p backside-illumination silicon photomultipliers by TCAD," Results in Physics 8 (2018) 76-78.
Acerbi et al., "Silicon Photomultipliers: Technology Optimizations for Ultraviolet, Visible and Near-Infrared Range Instruments," Instruments; vol. 3, Issue 1, Feb. 12, 2019.
Gola et al., "NUV-Sensitive Silicon Photomultiplier Technologies Developed at Fondazione Bruno Kessler," Sensors; vol. 19, Issue 2, Jan. 14, 2019.
Collazuol et al., "The SiPM Physics and Technology—a Review," PhotoDet 2012.
Sanzaro et al., "0.16 µm-BCD Silicon Photomultipliers with Sharp Timing Response and Reduced Correlated Noise," Sensors, vol. 18, Issue 11, Nov. 3, 2018.
Valvo et al., "Statistical Analysis of Dark Current in Silicon Photomultipliers," Sensordevices 2011: The Second International Conference on Sensor Device Technologies and Applications: Aug. 2011.
Pagano et al., "Dark Current in Silicon Photomultiplier Pixels: Data and Model," IEEE Transactions on Electron Devices, vol. 59, No. 9, Sep. 2012.

* cited by examiner

SEMICONDUCTOR DEVICES WITH SINGLE-PHOTON AVALANCHE DIODES AND ISOLATION STRUCTURES

This application is a continuation of U.S. patent application Ser. No. 17/302,836, filed May 13, 2021, which is hereby incorporated by reference herein in its entirety.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present technology relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
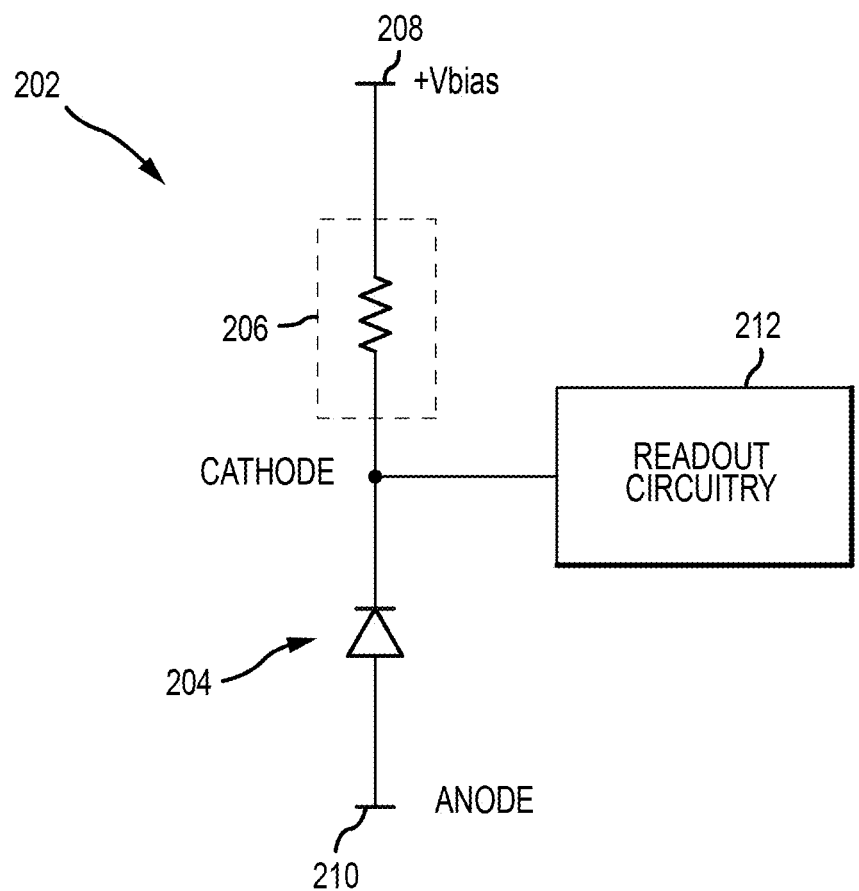
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
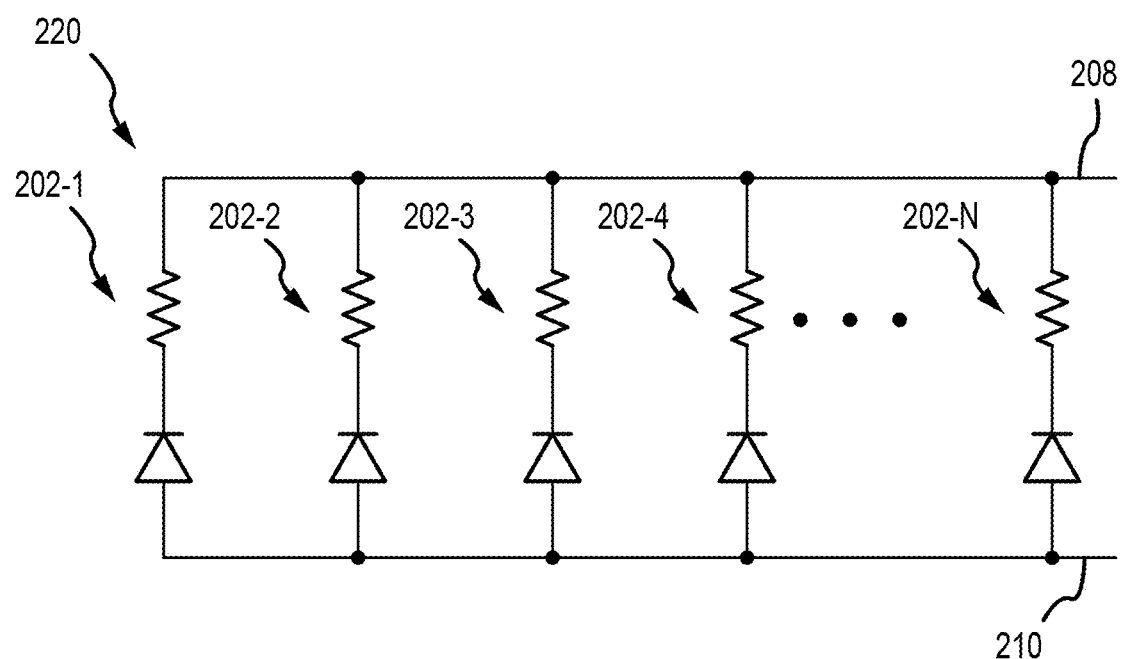
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, ..., SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
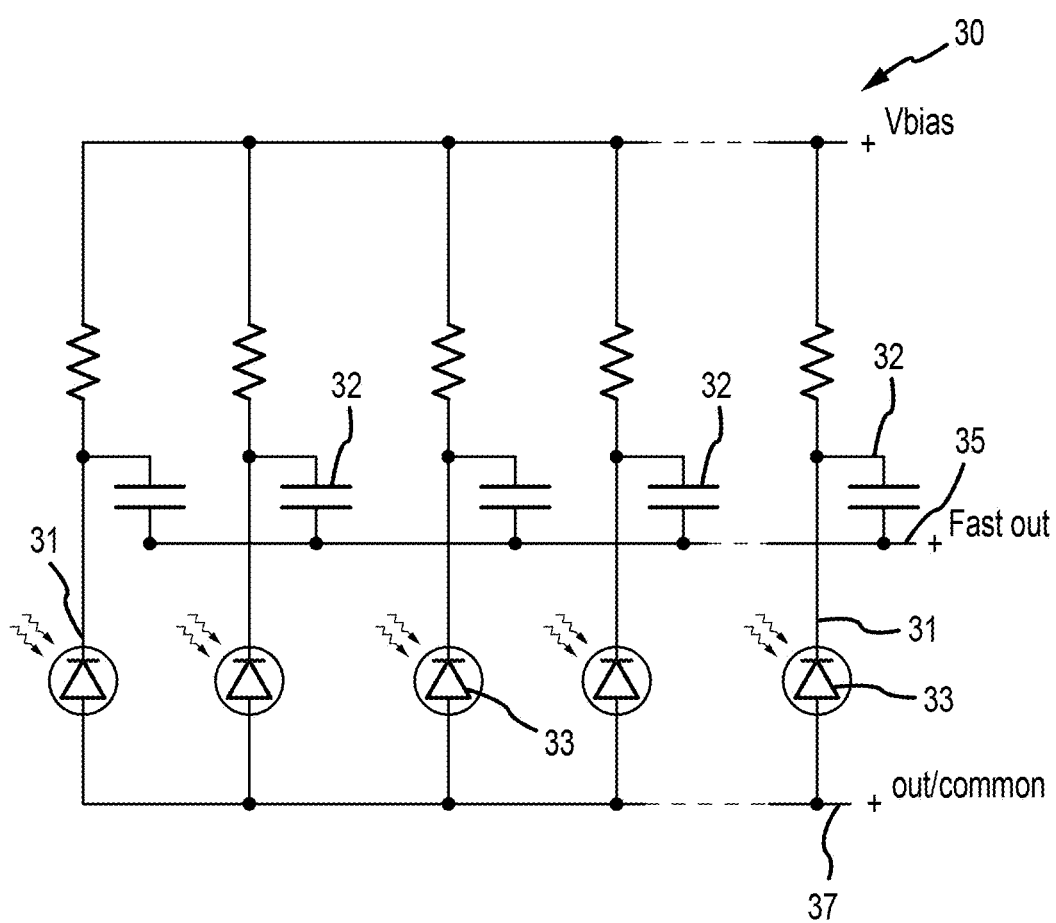
FIG. 3 is a diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
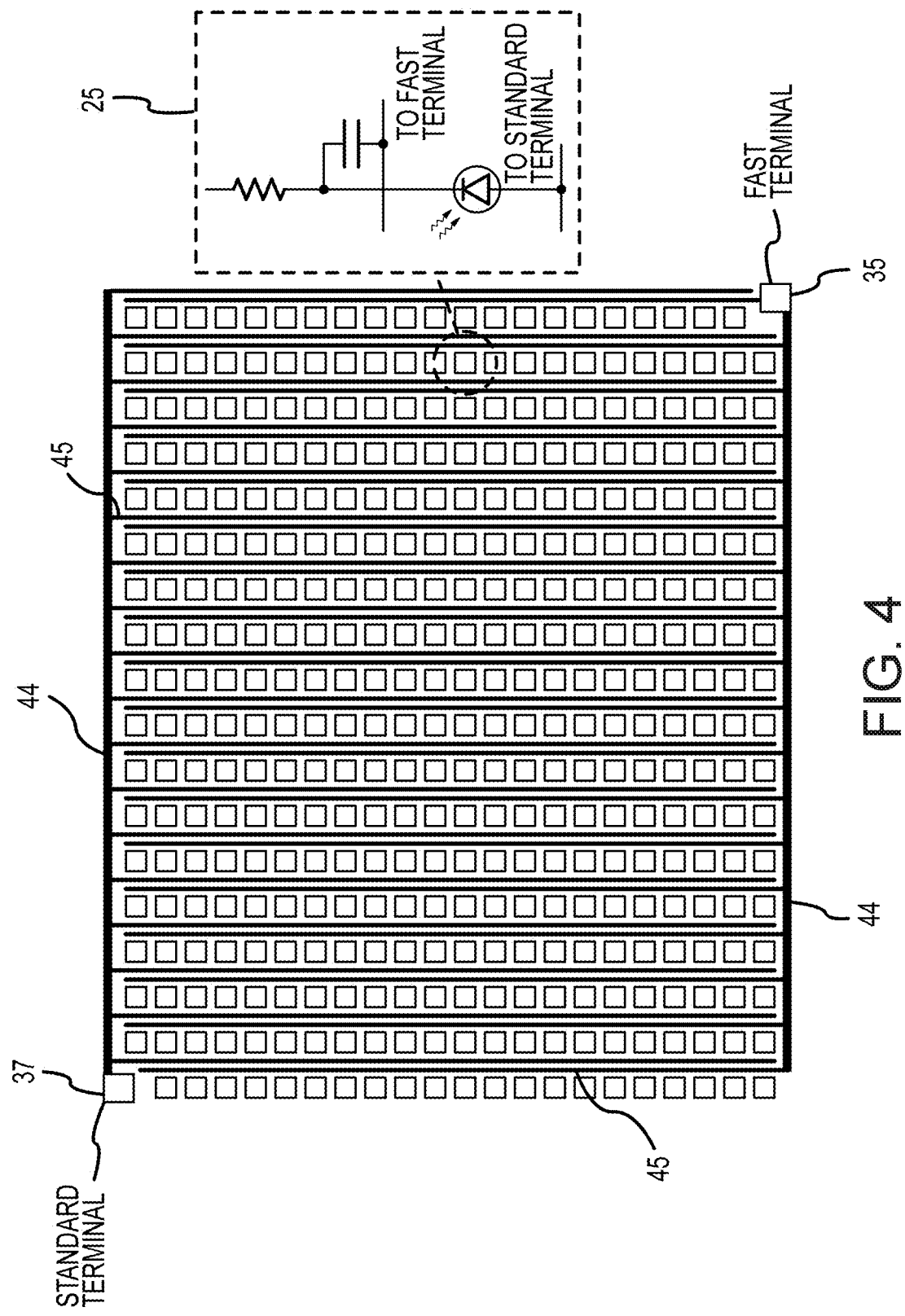
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus lines 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
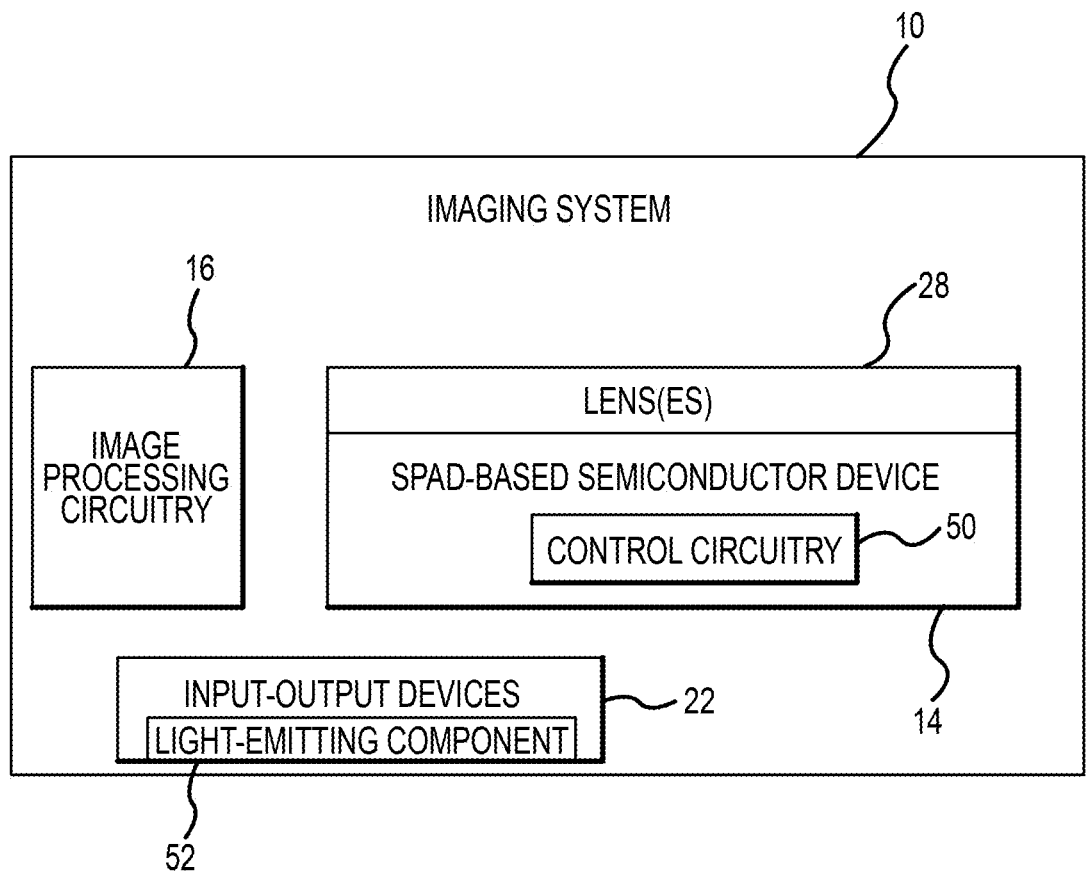
FIG. 5 is a diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system 10 may be used for LIDAR applications. Imaging system 10 may sometimes be referred to as a SPAD-based imaging system.

Imaging system 10 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

SPAD-based semiconductor device 14 may include circuitry such as control circuitry 50. The control circuitry for the SPAD-based semiconductor device may be formed either on-chip (e.g., on the same semiconductor substrate as the SPAD devices) or off-chip (e.g., on a different semiconductor substrate as the SPAD devices). The control circuitry may control operation of the SPAD-based semiconductor device. For example, the control circuitry may operate active quenching circuitry within the SPAD-based semiconductor device, may control a bias voltage provided to bias voltage supply terminal 208 of each SPAD, may control/monitor the readout circuitry coupled to the SPAD devices, etc.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc. Any of the aforementioned circuits may be considered part of the control circuitry 50 of FIG. 5.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene. In some cases, some or all of control circuitry 50 may be formed integrally with image processing circuitry 16.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component 52 may be included in the imaging system to emit light (e.g., infrared light or light of any other desired type). Light-emitting component 52 may be a laser, light-emitting diode, or any other desired type of light-emitting component. Semiconductor device 14 may measure the reflection of the light off of an object to measure distance to the object in a LIDAR (light detection and ranging) scheme. Control circuitry 50 that is used to control operation of the SPAD-based semiconductor device may also optionally be used to control operation of light-emitting component 52. Image processing circuitry 16 may use known times (or a known pattern) of light pulses from the light-emitting component while processing data from the SPAD-based semiconductor device.

The likelihood of a photon being absorbed (e.g., the absorption percentage) increases with increasing semiconductor depth. To improve the sensitivity of a SPAD-based semiconductor device, it would therefore be desirable to increase the thickness of the semiconductor substrate. However, manufacturing considerations and other design factors may prevent or discourage semiconductor substrates from being thick enough for a target absorption percentage. To increase the absorption percentage without increasing semiconductor substrate thickness, light scattering structures may be included in the SPAD-based semiconductor device. The scattering structures may scatter incident light (e.g., using a low-index material that fills trenches in the semiconductor substrate), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths. Scattering incident light may improve absorption efficiency but may also make the SPAD-based semiconductor device susceptible to crosstalk. Isolation structures may be included around each SPAD to prevent cross-talk between adjacent microcells. The SPAD-based semiconductor devices described herein may be used to sense near infrared light or light of any other desired type.

Figure 6:
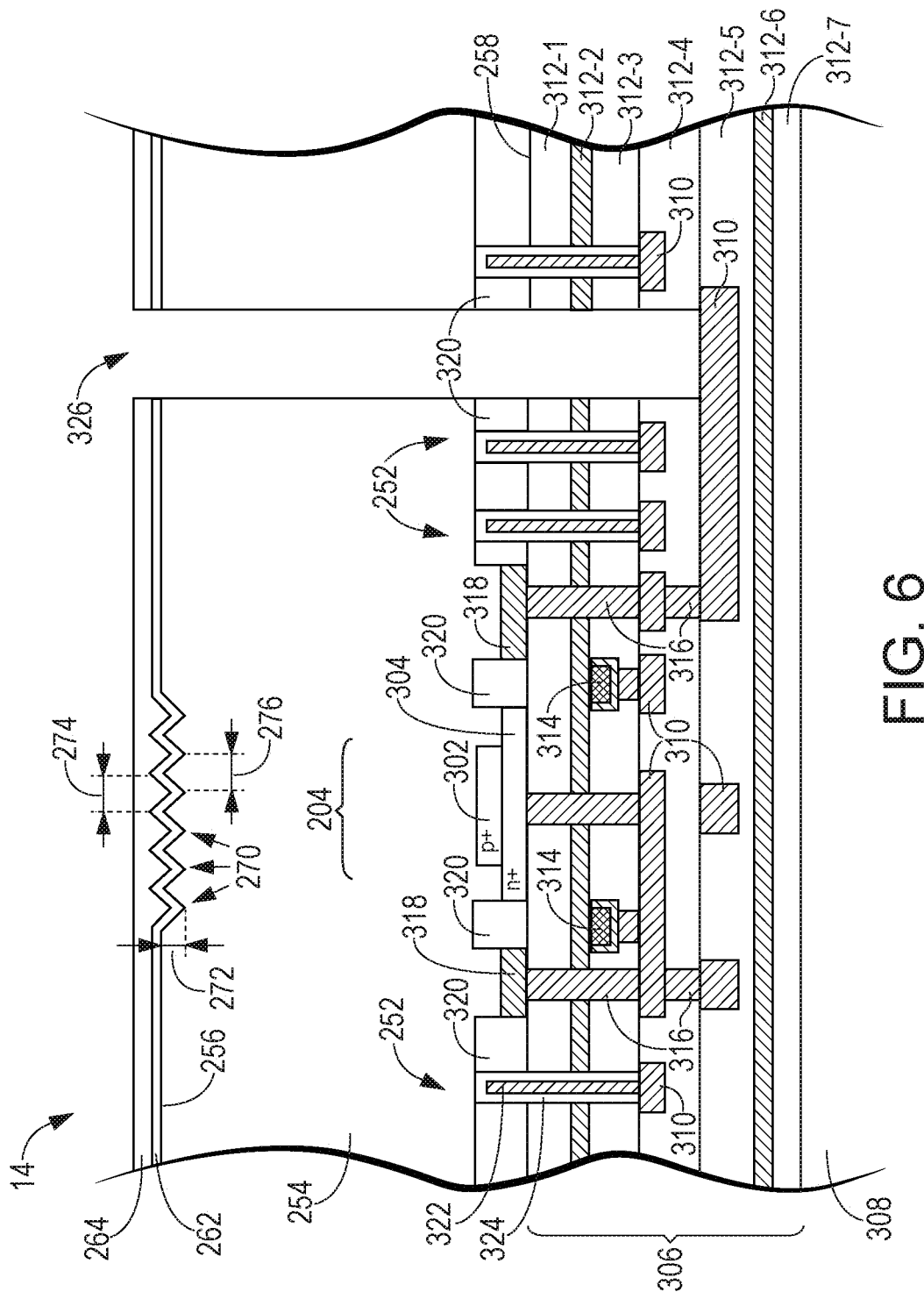
FIG. 6 is a cross-sectional side view of an illustrative SPAD-based semiconductor device that includes front side shallow trenches with a metal filler in accordance with an embodiment.

FIG. 6 is a cross-sectional side view of an illustrative SPAD-based semiconductor device having scattering structures and isolation structures. SPAD-based semiconductor device 14 includes a SPAD 204. Each SPAD may be considered part of a respective SPAD device, SPAD pixel, or microcell (e.g., microcell 202 in FIG. 1). The SPAD-based semiconductor device 14 in FIG. 6 is a backside illuminated (BSI) device (e.g., incident light passes through the back surface of the substrate). SPAD 204 may be isolated from the adjacent SPADs by isolation structures such as isolation structures 252.

As shown in FIG. 6, SPAD 204 is formed in a substrate 254 (e.g., a semiconductor substrate formed from a material such as silicon) that extends between the back surface 256 and the front surface 258. Substrate 254 may be formed by a p-type doped semiconductor layer (e.g., p-type doped epitaxial silicon). SPAD 204 is formed by the p-type doped semiconductor layer 254, a p-type doped deep enrichment layer 302, and a n-type doped region 304. The p-type doped enrichment layer 302 may sometimes be referred to as a p+ doped region (e.g., p+ region 302). The n-type doped region 304 may sometimes be referred to as n+ doped region 304, cathode region 304, n+ layer 304, n+ region 304, etc. It should be noted that if desired, the doping types of the p-type regions and n-type regions depicted herein may be reversed.

As shown in FIG. 6, substrate 254 may be attached to an interconnect and routing layer 306. Interconnect and routing layer 306 may include various conductive layers, insulating (dielectric) layers, and conductive vias for connecting different conductive layers. The interconnect and routing layer 306 may be attached to a handling wafer 308 during manufacturing.

Interconnect and routing layer 306 (sometimes referred to as conductive interconnect layer 306, interconnect layer 306, routing layer 306, metallization layer 306, contact module 306, etc.) includes a plurality of conductive (metal) layers as well as dielectric layers 312. In the example of FIG. 6, dielectric layers 312-1, 312-2, 312-3, 312-4, 312-5, 312-6, and 312-7 are included. Dielectric layers 312-2 and 312-6 may be formed from silicon nitride. Dielectric layers 312-4, 312-5, and 312-7 may be formed from silicon dioxide. These examples are merely illustrative. In general, each dielectric layer may be formed from any desired material (e.g., an organic or inorganic material).

One or more polysilicon resistors 314 may be formed in interconnect and routing layer 306. The polysilicon resistors may, for example, be part of quenching circuitry for the SPAD 204.

Conductive vias 316 may extend through one or more dielectric layers 312 to electrically connect different components within image sensor 14. As shown in FIG. 6, the conductive vias may connect different metal layers 310 within metallization layer 306. Additionally, the conductive vias may provide signals to anode/cathode contacts within the SPAD.

N-type doped region 304 may serve as a cathode contact for SPAD 204. In other words, the conductive via that terminates at n+ region 304 (such that the conductive via directly contacts n+ region 304) may provide a cathode voltage for the SPAD. SPAD 204 may also include a p+ type doped region 318 (sometimes referred to as anode region 318, p+ region 318, p+ layer 318, etc.). P+ type doped region 318 serves as an anode contact for SPAD 204. In other words, the conductive via that terminates at p+ region 318 (such that the conductive via directly contacts p+ region 318) may provide an anode voltage for the SPAD.

Shallow trench isolation (STI) 320 may separate anode region 318 form cathode region 304. STI 320 may be formed by etching front side trenches in substrate 254 (e.g., from surface 258 towards surface 256) then filling the trenches with an isolation material. The isolation material may be an oxide (e.g., silicon dioxide) or any other desired material.

Isolation structures may be included in SPAD-based semiconductor device 14 to prevent crosstalk between adjacent SPADs. FIG. 6 shows an example of structures that may be used to form isolation structures 252.

As shown in FIG. 6, isolation structures 252 may include a trench with one or more filler materials. The trench may be etched from the front side of the substrate (e.g., from front surface 258 towards back surface 256). Isolation structures 252 may include a light absorbing filler 322 in the trench. The light absorbing filler 322 may be formed from a metal such as tungsten and may therefore sometimes be referred to as metal filler 322 or tungsten filler 322. Metal filler 322 absorbs incident photons and improves isolation between SPAD 204 and adjacent SPADs.

A buffer layer 324 is formed adjacent to metal filler 322 (e.g., between the metal filler and the substrate) in isolation structures 252. Buffer layer 324 may be any desired material (e.g., silicon dioxide) and may be compatible with both the material of metal filler 322 and the materials surrounding isolation structures 252 (e.g., silicon). A high dielectric constant layer may also be included in the trench if desired.

In FIG. 6, the trench for isolation structures 252 is a shallow trench. The trench has the same depth as the trenches for STI 320, as an example. Isolation structures 252 may form a partial or complete ring around the microcell including SPAD 204. SPAD 204 may be laterally surrounded by isolation structures 252. Isolation structures 252 are interposed between SPAD 204 and adjacent SPADs.

FIG. 6 also shows how a through-silicon via 326 may be formed through substrate 254. Through-silicon via (TSV) 326 may be formed at the edge of the SPAD-based semiconductor device (e.g., to provide a contact for the SPAD-based semiconductor device). As shown in FIG. 6, isolation structures 252 may be formed around through-silicon via 326 in addition to SPAD 204. Including isolation structures 252 around through-silicon via 326 may improve electrical isolation of the through-silicon via and provide a moisture barrier for the through-silicon via. The isolation structures 252 may form a partial or complete ring around the through-silicon via 326. TSV 326 may be laterally surrounded by isolation structures 252.

Scattering structures 270 may also be formed in substrate 254. Scattering structures 270 may be configured to scatter incident light (e.g., using a low-index material that fills trenches in substrate 254), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths (e.g., near infrared light).

The material(s) that fill the trenches (e.g., buffer 264 and passivation layer 262) of light scattering structures 270 may have a lower refractive index than substrate 254 (e.g., a refractive index that is lower by more than 0.1, more than 0.2, more than 0.3, more than 0.5, more than 1.0, more than 1.5, more than 2.0, etc.). The low-index material in the trenches causes refractive scattering of incident light.

Scattering structures 270 scatter incident light, thereby increasing the path length of the light through the semiconductor substrate and increasing the probability of the incident light being absorbed by the semiconductor. Isolation structures 252 help prevent the scattered light from reaching an adjacent SPAD and causing cross-talk. In addition to preventing crosstalk of these primary emissions (e.g., photons from incident light), the isolation structures 252 may prevent crosstalk caused by secondary emissions (e.g., photons produced when an avalanche occurs in the SPAD).

The scattering structures may be formed using backside trenches (e.g., trenches that extend from surface 256 towards surface 258). The backside trenches may be filled by high dielectric constant coating 262 and buffer layer 264. The high dielectric constant coating 262 (sometimes referred to as high k coating 262 or passivation layer 262) may mitigate dark current. As one example, the passivation coating may be an oxide coating (e.g., aluminum oxide, hafnium oxide, tantalum oxide, etc.). A dielectric layer 264 (sometimes referred to as a buffer layer) may be formed over passivation coating 262. The buffer layer 264 may be formed from silicon dioxide or another desired material.

The light scattering structures each have a height 272 (sometimes referred to as depth) and a width 274. The light scattering structures also have a pitch 276 (e.g., the center-to-center separation between each light scattering structure). In general, each scattering structure may have a height 272 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. Each scattering structure may have a width 274 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The pitch 276 may be less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The ratio of the width 274 to the pitch 276 may be referred to as the duty cycle or the etch percentage for the substrate. The duty cycle (etch percentage) indicates how much unetched substrate is present between each pair of scattering structures and how much of the upper surface of the substrate is etched to form the light scattering structures. The ratio may be 100% (e.g., each scattering structure is immediately adjacent to surrounding scattering structures), lower than 100%, lower than 90%, lower than 70%, lower than 60%, greater than 50%, greater than 70%, between (and including) 50% and 100%, etc. The semiconductor substrate may have a thickness of greater than 4 micron, greater than 6 micron, greater than 8 micron, greater than 10 micron, greater than 12 micron, less than 12 micron, between 4 and 10 micron, between 5 and 20 micron, less than 10 micron, less than 6 micron, less than 4 micron, less than 2 micron, greater than 1 micron, etc.

In the example of FIG. 6, the scattering structures 270 have angled sidewalls (e.g., sidewalls that are non-orthogonal and non-parallel to back surface 256). The scattering structures may be pyramidal or may have a triangular cross-section that extends along a longitudinal axis (e.g., a triangular prism). The non-orthogonal angle may be greater than 10 degrees, greater than 30 degrees, greater than 60 degrees, less than 80 degrees, between 20 and 70 degrees, etc. The example of angled sidewalls in FIG. 6 is merely illustrative. The scattering structures may have vertical sidewalls (orthogonal to surface 256) if desired.

The arrangement and dimensions of scattering structures 270 may be selected to optimize the conversion of incident light for the particular SPAD-based semiconductor device.

One or more microlenses may optionally be formed over SPAD 204. In one example, SPAD 204 may be covered by a first microlens having a toroidal shape (e.g., a ring shape with a central opening) and a second microlens that fills the opening of the first microlens. The microlenses may focus light towards light scattering structures 270 and SPAD 204. This example is merely illustrative, and other microlens arrangements (e.g., a single toroidal microlens, a single microlens having an upper surface with spherical curvature, two cylindrical microlenses, etc.) may be used if desired.

The light scattering structures may have a uniform density (number of light scattering structures per unit area). Alternatively, the light scattering structures may have a non-uniform density. Arranging light scattering structures with a non-uniform density in this manner may help direct light to SPAD 204 in an optimal manner. In general, etching substrate 254 (e.g., to form light scattering structures) may cause an increase in dark current in the SPAD-based semiconductor device. Accordingly, light scattering structures may be omitted where possible to minimize dark current while still optimizing absorption. Omitting light scattering structures may include reducing the density of the light scattering structures to a non-zero magnitude or entirely omitting the light scattering structures in a certain area of the microcell (e.g., to a density of zero).

In general, each microcell (and corresponding SPAD) may be covered by any desired microlens(es). However, there may be a correlation between the microlens design and the arrangement of the light scattering structures for the microcell. The microlenses may focus more light on a first area of the substrate than a second area of the substrate. The light scattering structures may therefore have a greater density (e.g., a higher percentage of the substrate is etched for the scattering structures) in the first area of the substrate than the second area of the substrate (to more effectively scatter the light). The second area of the substrate (with a lower density of scattering structures) may have no scattering structures (e.g., the scattering structures are entirely omitted) or may have a lower, non-zero density of scattering structures. The transition between different densities may be gradual or immediate.

In FIG. 6, isolation structures 252 include metal filler in shallow front side trenches. This example is merely illustrative. There are many other possible arrangements for isolation structures 252. FIGS. 7-11 show additional arrangements that may be used for the isolation structures. It should be noted that, for simplicity, the description of common components (already described in connection with FIG. 6) are omitted in the description of FIGS. 7-11.

However, the description of the common components still apply to the subsequent figures.

Figure 7:
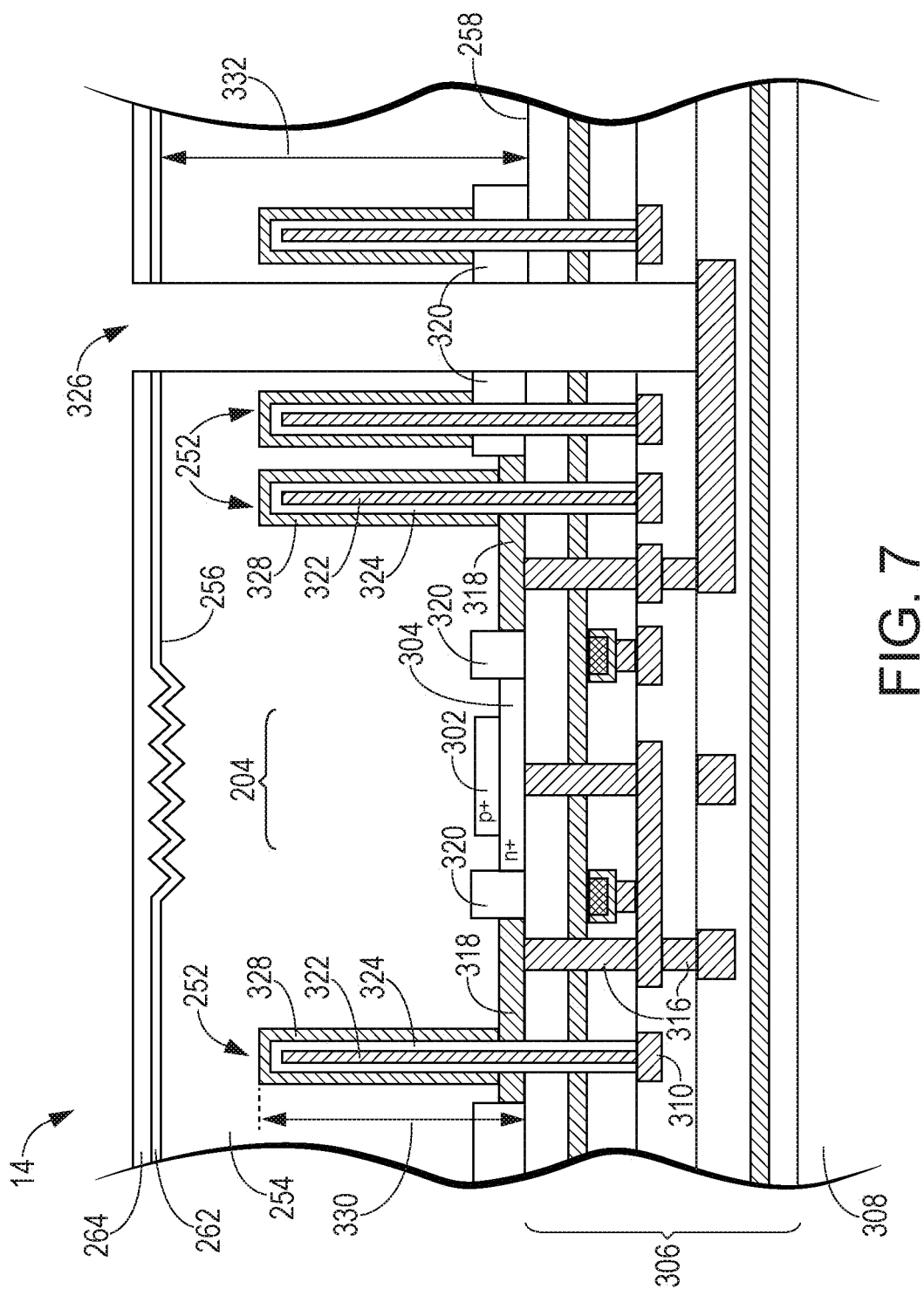
FIG. 7 is a cross-sectional side view of an illustrative SPAD-based semiconductor device that includes partial front side deep trenches with a metal filler in accordance with an embodiment.

In FIG. 7, isolation structures 252 have a similar arrangement as in FIG. 6. However, instead of metal filler 322 being formed in a front side shallow trench, the metal filler 322 in FIG. 7 is formed in a front side deep trench. As shown in FIG. 7, metal filler 322 and buffer layer 324 are formed in the front side deep trench to form isolation structures 252.

Additionally, isolation structures 252 may include a p-type doped liner 328. The p-type doped liner may be formed by doped portions of the semiconductor substrate adjacent to the trench for isolation structures 252. The p-type doped liner may suppress dark current. Also, as shown in FIG. 7, p-type doped liner 328 (sometimes referred to as p+ liner 328 or doped liner 328) is formed adjacent to and in direct contact with p+ layer 318. In this way, p+ liner 328 and p+ layer 318 collectively form the anode portion of SPAD 204. The anode contact of the semiconductor substrate therefore includes both p+ liner 328 and p+ region 318. In some cases (i.e., using a different nomenclature), p+ liner 328 and p+ region 318 may be referred to collectively as a single p+ region that serves as both an anode contact and a liner for the isolation structures. Having the anode contact extend deeper into the semiconductor substrate in this way improves the performance of SPAD 204 (by better shaping the active area of the SPAD).

In addition to improved performance due to the presence of the p+ liner 328, isolation structures 252 may provide improved isolation relative to the arrangement of FIG. 6. In FIG. 7, the semiconductor substrate 254 has a total thickness 332 and the trench for isolation structures 252 extends into the substrate with a depth 330. Depth 330 may be at least 40% of total thickness 332, at least 50% of total thickness 332, at least 60% of total thickness 332, at least 70% of total thickness 332, at least 80% of total thickness 332, between 20% and 90% of the total thickness 332, etc. However, depth 330 may be less than 100% of the total thickness 332. A larger depth for the isolation structures means that light absorbing filler 322 penetrates further into the substrate, improving isolation.

The material used to form buffer layer 324 may have a lower index of refraction than the material used to form semiconductor substrate 254. This results in high-angled light reflecting off the buffer layer (instead of passing through the buffer layer and being absorbed by light absorbing filler 322). Reflecting high-angled light in this manner may reduce unwanted absorption of incident light. The refractive index of buffer layer 324 may be lower than the refractive index of semiconductor substrate 254 by more than 0.1, more than 0.2, more than 0.3, more than 0.5, more than 1.0, more than 1.5, more than 2.0, etc.

In FIGS. 6 and 7, light absorbing filler 322 extends through some of the metallization layers 306 (in addition to semiconductor substrate 254). In FIGS. 6 and 7, the light absorbing material extends from a metal layer 310 through dielectric layers 312 to reach semiconductor substrate 254. However, in FIG. 6 the light absorbing filler is uniform in both portions of the isolation structure surrounded by dielectric layers 312 and portions of the isolation structure surrounded by STI 320. Similarly, in FIG. 7 the light absorbing filler is uniform in both portions of the isolation structure surrounded by dielectric layers 312 and portions of the isolation structure surrounded by p+ region 318 and semiconductor substrate 254. These examples are, however, merely illustrative.

In the examples of FIGS. 6 and 7, the trenches that form isolation structures 252 may be formed at a separate etching step than conductive vias 310. Consider the example of FIG. 6. For this SPAD-based semiconductor device, the trench for isolation structures 252 may be formed through dielectric layers 312 (e.g., 312-1, 312-2, and 312-3) and a portion of STI 320 in a single etching step. Subsequently, buffer layer 324 may be deposited into the trench. Next, trenches may be etched for conductive vias 316 in a second etching step. Finally, a metal filler is deposited into the trenches for both isolation structures 252 and conductive vias 316. The material used to form metal filler 322 and conductive vias 316 may therefore be the same.

To form the SPAD-based semiconductor device of FIG. 7, the trench for isolation structures 252 may be formed through dielectric layers 312 (e.g., 312-1, 312-2, and 312-3). Next, a p-type implantation (e.g., of boron or another p-type dopant) may be performed to form the p+ liner 328. After an annealing step, the buffer layer 324 may be formed in the deep trenches for isolation structures 252. Next, trenches may be etched for conductive vias 316 in a second etching step. Finally, a metal filler is deposited into the trenches for both isolation structures 252 and conductive vias 316. The material used to form metal filler 322 and conductive vias 316 may therefore be the same.

Figure 8:
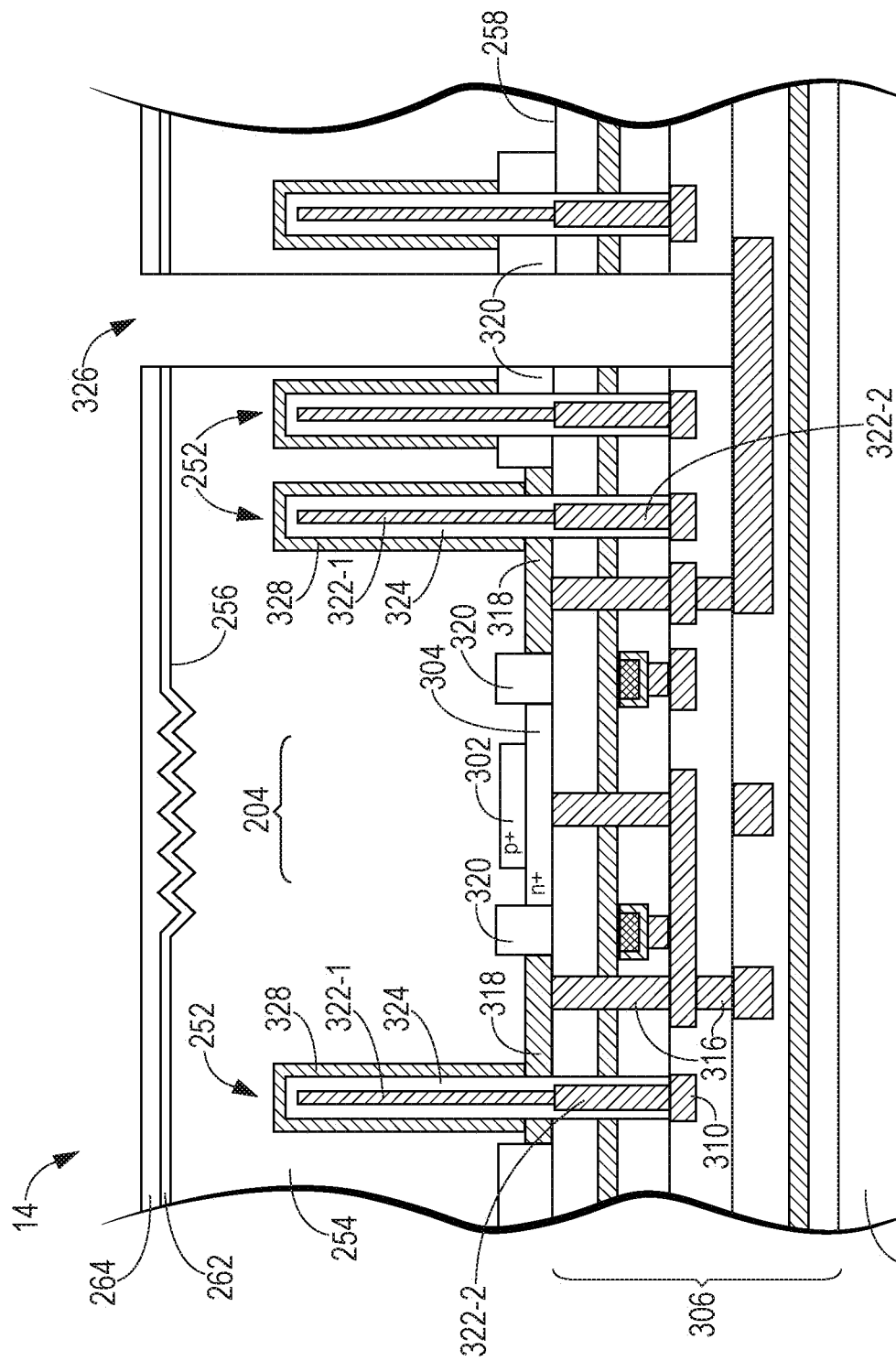
FIG. 8 is a cross-sectional side view of an illustrative SPAD-based semiconductor device that includes partial front side deep trenches with metal filler that is electrically connected to metal contacts with separately formed conductive material in accordance with an embodiment.

In FIG. 8, the metal filler 322 of isolation structures 252 is deposited in two steps. Consequently, the isolation structures include a first portion of metal filler 322-1 and a second portion of metal filler 322-2. The arrangement of the isolation structures is otherwise the same as in FIG. 7. However, the width of metal filler portion 322-1 may be different than the width of metal filler portion 322-2 (as shown in the example of FIG. 8). The width of metal filler portion 322-2 may be the same as the width of conductive vias 316 for ease of manufacturing.

To form the SPAD-based semiconductor device of FIG. 8, deep trenches may be formed and filled with buffer layer 324. A sacrificial layer may also be formed in the trenches at this stage (e.g., sacrificial polysilicon that will be later removed and replaced with the metal filler). Also, a p-type implantation (e.g., of boron or another p-type dopant) may be performed to form the p+ liner 328. After forming some of the dielectric layers 312 and metal layers 310 of interconnect and routing layer 306, etching may be performed to form trenches in the dielectric layers for the conductive vias 316, to form trenches in the dielectric layers for isolation structures 252, and to remove the sacrificial polysilicon from the deep trench in semiconductor substrate 254. Then, the trenches may be filled with metal filler (e.g., tungsten).

The examples in FIGS. 6-8 of having front side isolation structures that extend only partially into semiconductor substrate 254 are merely illustrative. In another possible arrangement, the isolation structures may extend fully through the semiconductor substrate. The isolation structures may be partially filled with a metal, light absorbing filler (e.g., tungsten) and may be partially filled with a different material.

Figure 9:
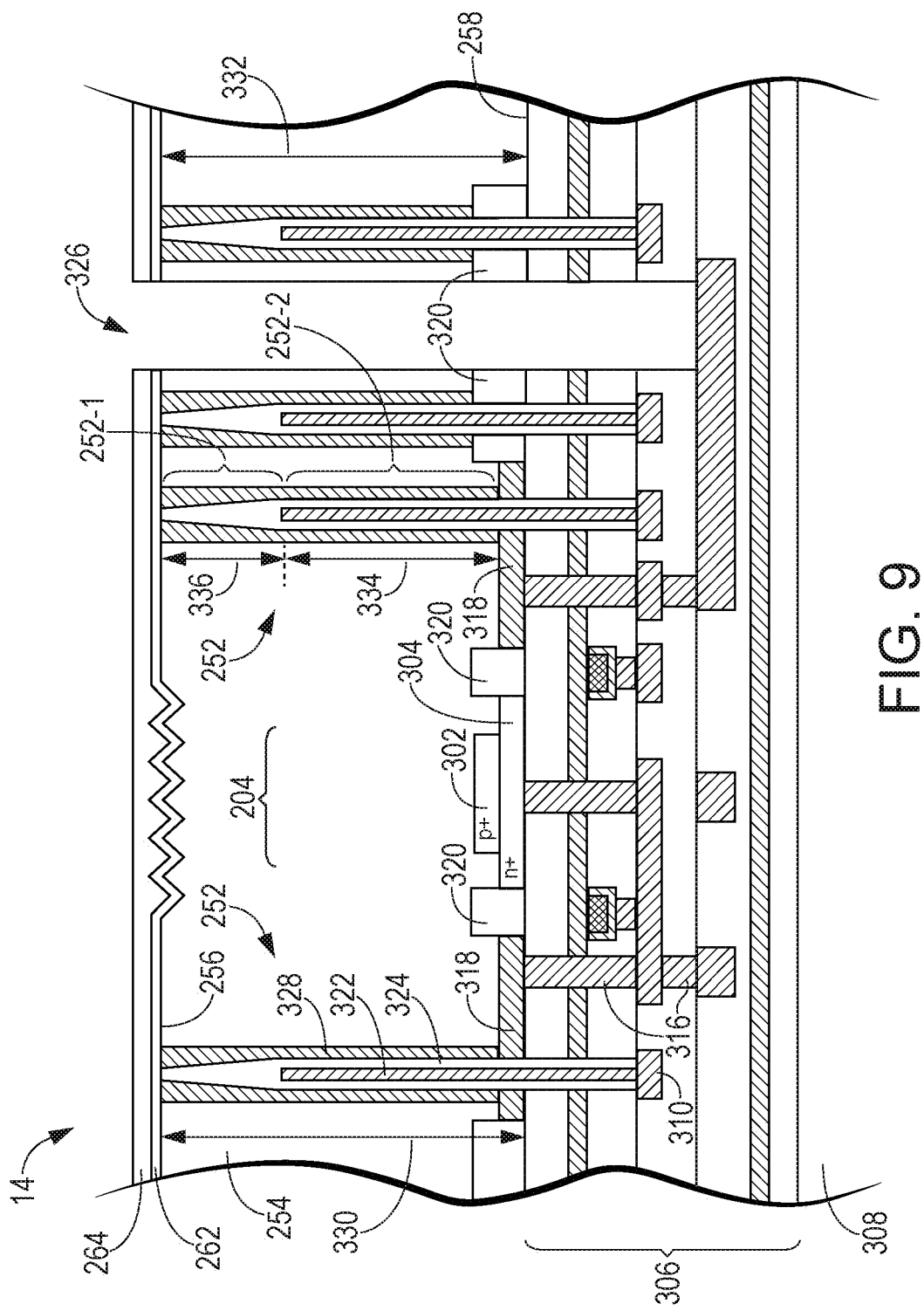
FIG. 9 is a cross-sectional side view of an illustrative SPAD-based semiconductor device that includes front side deep trenches that extend completely through the semiconductor substrate, that are partially filled with metal, and that have a tapered portion in accordance with an embodiment.

As shown in FIG. 9, isolation structures 252 have a depth 330 through the semiconductor substrate that is equal to the total thickness 332 of the semiconductor substrate. The isolation structures may have a metal filler 322 (e.g., tungsten) that absorbs light to prevent crosstalk between adjacent SPADs. Metal filler 322 may be surrounded by buffer layer 324 (e.g., silicon dioxide). A p-type doped liner 328 may also be included in isolation structures 252.

The isolation structures may have a first portion 252-1 and a second portion 252-2. The metal filler 322 is included only in the second portion 252-2. In the first portion 252-1, the same material that is used to form buffer layer 324 is used to fill the trench. Therefore, metal filler 332 has a depth 334 in substrate 254 that is less than the total thickness of substrate 254. Depth 334 may be at least 40% of total thickness 332, at least 50% of total thickness 332, at least 60% of total thickness 332, at least 70% of total thickness 332, at least 80% of total thickness 332, between 20% and 90% of the total thickness 332, etc. However, depth 334 may be less than 100% of the total thickness 332. Depth 336 may make up the remaining portion of the total semiconductor thickness.

To manufacture a device of the type shown in FIG. 9, a front side deep trench may be formed in semiconductor substrate 254 (e.g., from surface 258 towards the back surface). A p-type doping implant may then be performed to form p-type liner 328. Next, material for buffer layer 324 may be deposited in the trench. Subsequently, the metal filler 322 may be deposited in the trench. Trenches for conductive vias 316 may then be etched and filled with metal filler. Finally, the semiconductor substrate may be thinned (e.g., etched, ground, cut, etc.) from the backside to reveal the deep trench isolation structures. Before thinning, the front side deep trenches for isolation structures 252 may extend only partially through the total thickness of the semiconductor substrate. After thinning, the front side deep trenches for isolation structures 252 are 'revealed' and extend through the total thickness of substrate 254.

Having a full trench (that extends entirely through the substrate 254) may eliminate electrical crosstalk between adjacent SPADs. Only partially filling the front side trench with metal filler 322 may ensure that the metal filler 322 is not exposed/contacted during the substrate thinning process during manufacturing. Additionally, including buffer layer 324 across the full thickness of semiconductor substrate 254 may improve SPAD efficiency (due to total internal reflection at the buffer layer interface keeping incident light within the given SPAD area).

In the example of FIG. 9, the trenches for isolation structures 252 are tapered in portion 252-1. In other words, the trenches have a maximum thickness at the interface between portions 252-1 and 252-2. The trenches have a minimum thickness at the back surface 256. The trench width gradually decreases between the maximum thickness and the minimum thickness across portion 252-1. Providing the trench with a tapered structure in portion 252-1 may prevent tungsten from reaching too deep in the trenches.

Figure 10:
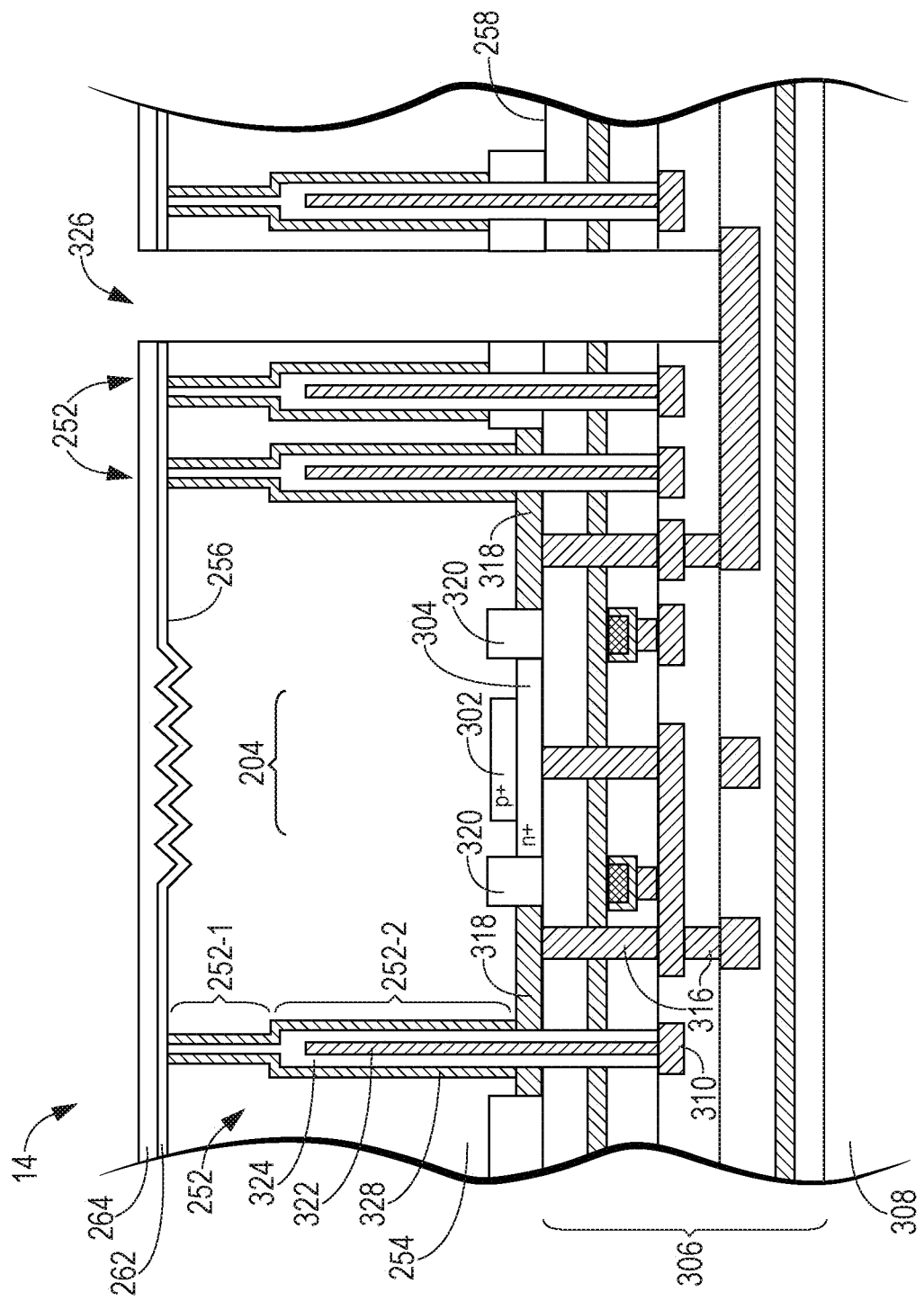
FIG. 10 is a cross-sectional side view of an illustrative SPAD-based semiconductor device that includes front side deep trenches that extend completely through the semiconductor substrate, that are partially filled with metal, and that have first and second portions with different widths in accordance with an embodiment.

In FIG. 10, isolation structures 252 again have portions 252-1 and 252-2 (similar to as in FIG. 9). However, the different portions 252-1 and 252-2 in FIG. 10 may be formed in separate steps, meaning the different portions have different properties. For example, as shown in FIG. 10, the total trench width in portion 252-1 may be smaller than the total trench width in portion 252-2. As another example, the concentration of dopant for liner 328 may be different in portion 252-1 than in portion 252-2. This may be used to, for example, have a lower doping concentration in portion 252-1 (closer to the back surface 256) than in portion 252-2. Having a lower doping concentration in portion 252-1 may be advantageous for sensor performance.

To manufacture a device of the type shown in FIG. 10, a partial etch of a front side deep trench may be performed in semiconductor substrate 254 (e.g., from surface 258 towards the back surface). This trench may receive a first p-type doping implant to form p-type liner 328 for portion 252-1. The trench may then be filled with material for buffer layer 324 (e.g., silicon dioxide), followed by a directional etch to form an oxide spacer along the sidewalls of the trench. Next, a second front side deep trench etching step may be performed to form the trench for portion 252-2 of the isolation structures. The second trench may have a greater width than the first trench, as one example. The trench may receive a second p-type doping implant to form p-type liner 328 for portion 252-2. Next, material for buffer layer 324 may be deposited in the trench for portion 252-2. Subsequently, the metal filler 322 may be deposited in the trench. Trenches for conductive vias 316 may then be etched and filled with metal filler. Finally, the semiconductor substrate may be thinned (e.g., etched, ground, cut, etc.) from the backside. Before thinning, the front side deep trenches for isolation structures 252 may extend only partially through the total thickness of the semiconductor substrate. After thinning, the front side deep trenches for isolation structures 252 extend through the total thickness of substrate 254. The two-step process used to form the isolation structures of FIG. 10 may allow for more optimization of the design of isolation structures 252.

In FIGS. 9 and 10, the material used to fill isolation structure portions 252-1 is the same material that is used for buffer layer 324 in isolation structure portions 252-2. This example is merely illustrative. In another possible arrangement, shown in FIG. 11, the isolation structure may have a different filler material in portion 252-1. The first portion 252-1 has a first filler 338 whereas the second portion 252-2 has a second filler 322.

The second filler 322 may be a light absorbing filler such as tungsten, similar to as previously discussed. Filler material 338 may be polysilicon, borophosphosilicate glass (BPSG), or another desired material. Buffer layer 324 may still be formed in both portion 252-1 and 252-2 of the isolation structures.

Figure 11:
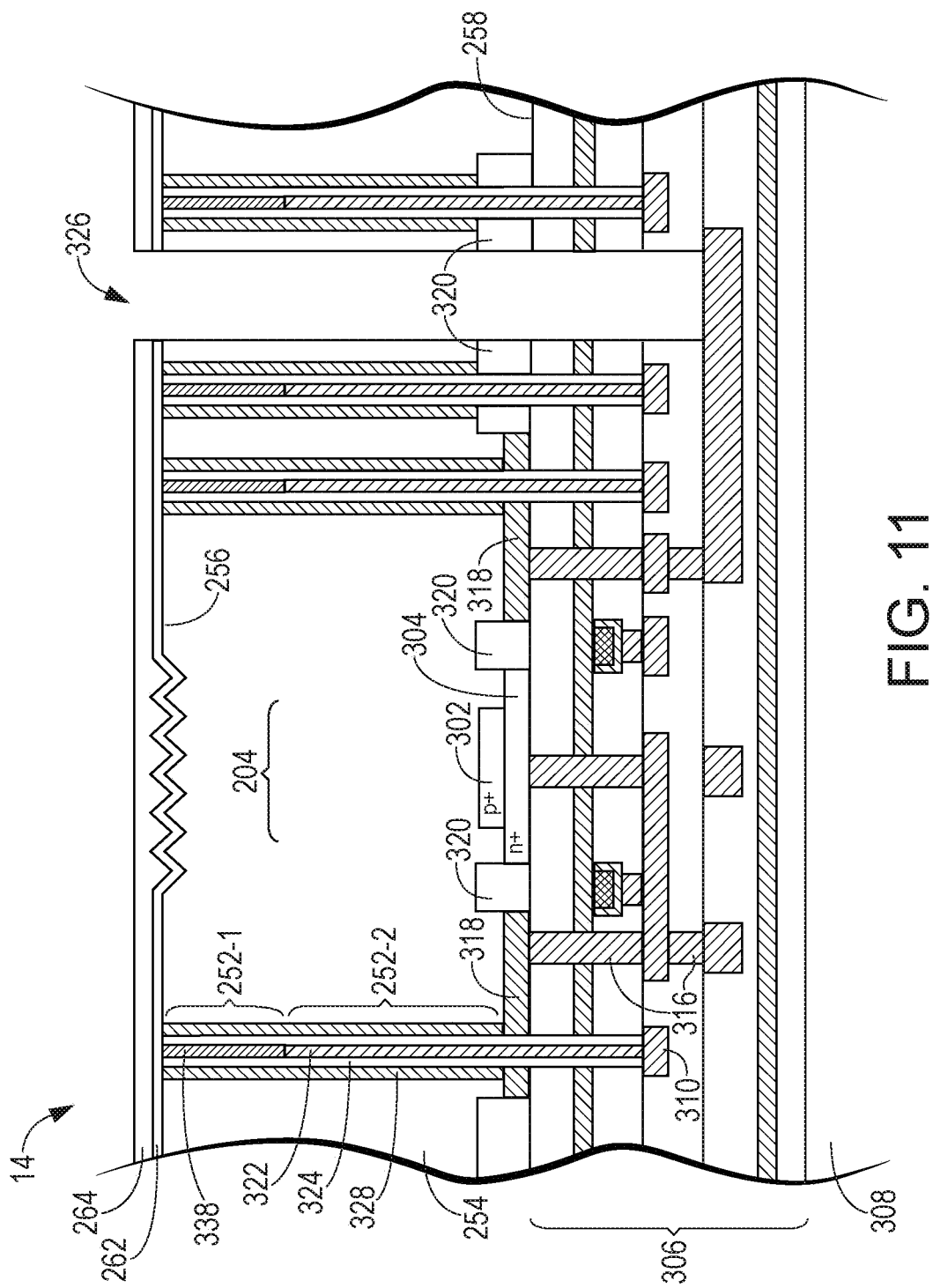
FIG. 11 is a cross-sectional side view of an illustrative SPAD-based semiconductor device that includes front side deep trenches that extend completely through the semiconductor substrate, that are partially filled with metal, and that are partially filled with an additional non-metal filler material in accordance with an embodiment.

To manufacture a device of the type shown in FIG. 11, a front side deep trench may be formed in semiconductor substrate 254 (e.g., from front surface 258 towards the back surface). A p-type doping implant may then be performed to form p-type liner 328. Next, material for buffer layer 324 may be deposited in the trench. An additional liner (e.g., silicon nitride) may also be formed in the trench if desired. Subsequently, the first filler 338 may be deposited in the trench. Examples of the first filler layer 338 include polysilicon or a doped silicon dioxide layer such as BPSG. After deposition, the first filler may be etched such that the first filler is included for only a desired portion of the trench (e.g., portion 252-1). After the first filler is partially removed, the second filler 322 may be formed in the trench (e.g., in portion 252-2). Trenches for conductive vias 316 may then be etched and filled with metal filler. Finally, the semiconductor substrate may be thinned (e.g., etched, ground, cut, etc.) from the backside. Before thinning, the front side deep trenches for isolation structures 252 may extend only partially through the total thickness of the semiconductor substrate. After thinning, the front side deep trenches for isolation structures 252 extend through the total thickness of substrate 254.

It should be noted that, in any of the arrangements of FIGS. 6-11, the metal filler 322 may be held at ground or another bias voltage as desired. The metal layer 310 that is electrically connected to the metal filler may provide the bias voltage for metal filler 322.

The foregoing is merely illustrative of the principles of this invention and various modifications can be made by those skilled in the art. The foregoing embodiments may be implemented individually or in any combination.

What is claimed is:

1. A semiconductor device comprising:
a substrate having first and second opposing surfaces;
a conductive interconnect layer adjacent to the substrate, proximate to the first surface;
a photosensitive area in the substrate; and
an isolation structure in the substrate that is interposed between the photosensitive area and an adjacent photosensitive area, wherein the isolation structure extends completely through the substrate from the first surface to the second surface, wherein the isolation structure comprises a metal filler and an additional filler in a trench, wherein the trench has a p-type doped semiconductor liner, wherein the additional filler comprises polysilicon or doped silicon dioxide, and wherein the metal filler is interposed between the first surface and the additional filler in a direction orthogonal to the first surface.

2. The semiconductor device defined in claim 1, wherein the isolation structure includes a buffer layer that is interposed between the metal filler and the p-type doped semiconductor liner.

3. The semiconductor device defined in claim 2, wherein the buffer layer comprises silicon dioxide.

4. The semiconductor device defined in claim 1, wherein the metal filler comprises tungsten.

5. The semiconductor device defined in claim 1, wherein the metal filler and the additional filler have an interface, wherein the metal filler is formed between the first surface of the substrate and the interface in the direction orthogonal to the first surface, and wherein the additional filler is formed between the second surface of the substrate and the interface in the direction orthogonal to the first surface.

6. The semiconductor device defined in claim 1, further comprising:
a metal layer that is electrically connected to the metal filler and that provides a bias voltage for the metal filler.

7. The semiconductor device defined in claim 1, further comprising:
a p-type doped region in the substrate, wherein the p-type doped semiconductor liner is electrically connected to the p-type doped region and wherein the p-type doped semiconductor liner and the p-type doped region collectively serve as an anode contact for the photosensitive area.

8. The semiconductor device defined in claim 1, wherein the conductive interconnect layer comprises at least one dielectric layer and a metal layer and wherein the metal filler extends through the at least one dielectric layer to reach the metal layer.

9. The semiconductor device defined in claim 1, further comprising:
a through-silicon via that extends completely through the substrate in the direction orthogonal to the first surface.

10. A semiconductor device comprising:
a substrate;
a photosensitive area in the substrate; an isolation structure in the substrate that is interposed between the photosensitive area and an adjacent photosensitive area, wherein the isolation structure comprises a metal filler in a trench and wherein the trench has a p-type doped semiconductor liner;
a p-type doped region in the substrate, wherein the p-type doped semiconductor liner is electrically connected to the p-type doped region and wherein the p-type doped semiconductor liner and the p-type doped region collectively serve as an anode contact for the photosensitive area; and
a conductive interconnect layer adjacent to the substrate, wherein the conductive interconnect layer comprises at least one dielectric layer and a metal layer and wherein the metal filler extends through the at least one dielectric layer to reach the metal layer.

11. The semiconductor device defined in claim 10, wherein the isolation structure comprises a buffer layer that is interposed between the metal filler and the p-type doped semiconductor liner and wherein the buffer layer comprises silicon dioxide.

12. The semiconductor device defined in claim 10, further comprising:
a through-silicon via that extends completely through the substrate and the at least one dielectric layer to an additional metal layer in the conductive interconnect layer.

13. The semiconductor device defined in claim 12, wherein the isolation structure is a first isolation structure and wherein the semiconductor device further comprises:
a second isolation structure in the substrate, wherein the p-type doped region is interposed between the first and second isolation structures;
a third isolation structure in the substrate, wherein the third isolation structure is interposed between the second isolation structure and the through-silicon via; and
a fourth isolation structure in the substrate, wherein the through-silicon via is interposed between the third and fourth isolation structures.

14. The semiconductor device defined in claim 13, further comprising:
shallow trench isolation, wherein the third and fourth isolation structures extend through the shallow trench isolation.

15. The semiconductor device defined in claim 10, further comprising:
an additional isolation structure in the substrate, wherein the p-type doped region is interposed between the isolation structure and the additional isolation structure.

16. The semiconductor device defined in claim 10, wherein the conductive interconnect layer comprises a conductive via connected to the metal layer and wherein the conductive via and the metal filler are formed from the same material.

17. The semiconductor device defined in claim 10, wherein the isolation structure extends through the substrate from a first surface of the substrate towards a second surface of the substrate and wherein the isolation structure does not extend completely through the substrate.

18. A semiconductor device comprising:
a substrate having first and second opposing surfaces;
a conductive interconnect layer adjacent the first surface;
a photosensitive area in the substrate; and
an isolation structure in the substrate that is interposed between the photosensitive area and an adjacent photosensitive area, wherein the isolation structure extends completely through the substrate between the first and second surfaces, wherein the isolation structure comprises a metal filler and a non-metal filler in a trench, wherein the metal filler and the non-metal filler have an interface, wherein the metal filler is formed between the first surface of the substrate and the interface, and wherein the non-metal filler is formed between the second surface of the substrate and the interface.

19. The semiconductor device defined in claim 18, wherein the trench comprises a p-type doped semiconductor liner.

20. The semiconductor device defined in claim 19, further comprising:
 a p-type doped region in the substrate, wherein the p-type doped semiconductor liner is electrically connected to the p-type doped region and wherein the p-type doped semiconductor liner and the p-type doped region collectively serve as an anode contact for the photosensitive area.

\* \* \* \* \*